United States Patent [19]

Mroczkowski

[11] Patent Number: 4,904,542
[45] Date of Patent: Feb. 27, 1990

[54] MULTI-LAYER WEAR RESISTANT COATINGS

[75] Inventor: Susan J. Mroczkowski, Franklin, Wis.

[73] Assignee: Midwest Research Technologies, Inc., Milwaukee, Wis.

[21] Appl. No.: 255,454

[22] Filed: Oct. 11, 1988

[51] Int. Cl.$^4$ ............................................. B32B 15/04
[52] U.S. Cl. ...................... 428/610; 428/627; 428/628; 428/629; 428/635; 428/660; 428/336; 428/698; 428/702; 416/241 B
[58] Field of Search ............... 428/610, 621, 627, 628, 428/629, 635, 660, 336, 698, 702; 416/241 B

[56] References Cited

U.S. PATENT DOCUMENTS

| | | | |
|---|---|---|---|
| 3,011,761 | 12/1961 | Conway et al. | 416/90 R |
| 3,041,040 | 6/1962 | Levinstein | 416/224 |
| 3,163,563 | 12/1964 | Douglass et al. | 428/610 |
| 3,215,512 | 11/1965 | Coad | 428/635 |
| 3,301,530 | 1/1967 | Lull | 416/241 R |
| 3,383,235 | 5/1968 | Blackburn et al. | 428/629 |
| 3,561,886 | 2/1971 | Kreischer, Jr. et al. | 416/224 |
| 3,748,110 | 7/1973 | Hodshire et al. | 29/197 |
| 3,758,233 | 9/1973 | Cross et al. | 416/229 |
| 3,787,223 | 1/1974 | Reedy, Jr. | 117/69 |
| 3,802,933 | 4/1974 | Rausch et al. | 428/610 |
| 3,849,865 | 11/1974 | Gedwell et al. | 29/460 |
| 3,859,061 | 1/1975 | Speirs et al. | 29/195 |
| 3,951,612 | 4/1976 | Gates et al. | 29/195 |
| 3,993,454 | 11/1976 | Giggins, Jr. et al. | 29/194 |
| 4,318,672 | 3/1982 | Hansen | 416/224 |
| 4,337,300 | 6/1982 | Itaba et al. | 428/627 |
| 4,411,960 | 10/1983 | Mizuhara | 428/610 |
| 4,429,019 | 1/1984 | Schrewelius | 428/550 |
| 4,446,199 | 5/1984 | Gedwill et al. | 428/639 |
| 4,450,205 | 5/1984 | Itaba et al. | 428/627 |
| 4,492,522 | 1/1985 | Rossmann et al. | 416/241 R |
| 4,511,633 | 4/1985 | Bruno et al. | 428/666 |
| 4,629,397 | 12/1986 | Schweitzer | 416/96 R |
| 4,639,399 | 1/1987 | Aprigliano | 428/623 |
| 4,775,576 | 10/1988 | Bouchand et al. | 428/702 |
| 4,778,649 | 10/1988 | Niino et al. | 428/610 |
| 4,799,977 | 1/1989 | Rausch | 428/610 |

FOREIGN PATENT DOCUMENTS 289173  11/1988  European Pat. Off. ............ 428/698
1096294  6/1965  United Kingdom .

OTHER PUBLICATIONS

Defensive Publication T905,005, Filed Dec. 19, 1972 by L. E. Helwig et al.

Primary Examiner—L. Dewayne Rutledge
Assistant Examiner—George Wyszomierski
Attorney, Agent, or Firm—Quarles & Brady

[57] ABSTRACT

An erosion and corrosion resistant coating is formed of a plurality of alternating layers of metallic and ceramic materials. The two materials selected for the layers have complementary wear resistant characteristics, such that one is relatively ductile and the other is relatively brittle. The concentration of the two materials at the interface between adjacent layers is graded to improve the adhesion of the layers and to provide a more unified coating. Prefereably radio-frequency sputtering is employed to deposit the coating, since it does not produce excessive heating which could negate any prior heat treatment of the substrate onto which the coating is deposited.

13 Claims, 1 Drawing Sheet

U.S. Patent     Feb. 27, 1990     4,904,542
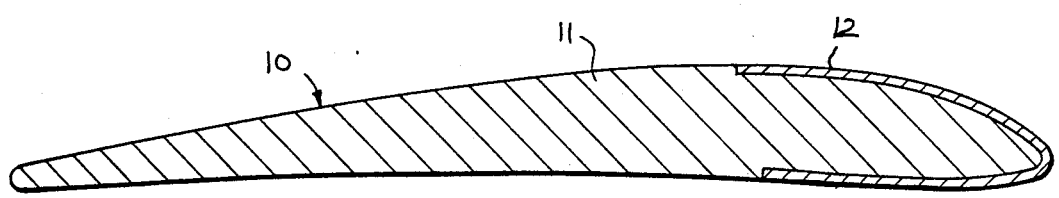
FIG. 1
FIG. 2
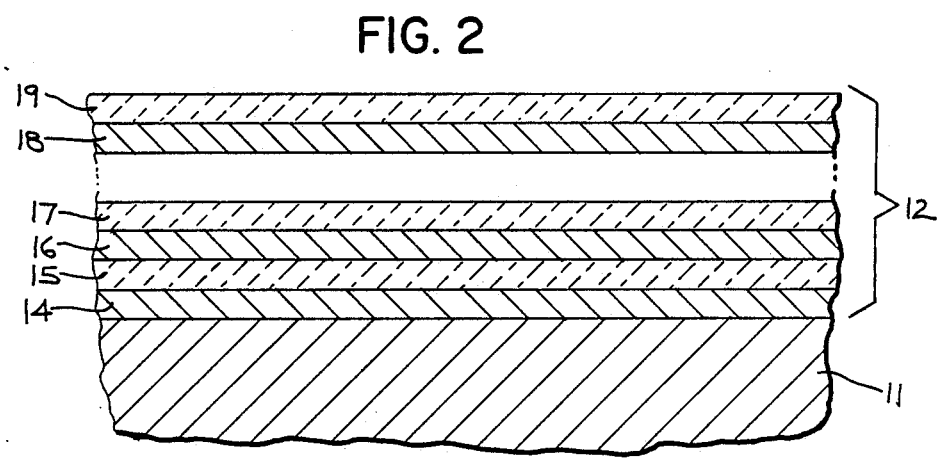
FIG. 3
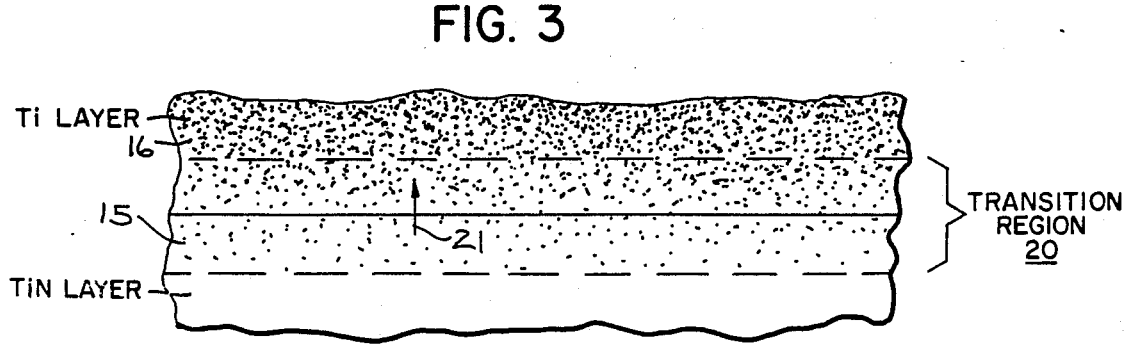

MULTI-LAYER WEAR RESISTANT COATINGS

BACKGROUND OF INVENTION

The present invention relates to wear resistant coatings for substrates and more particularly to such coatings which resist the erosion effects of particles impacting the coated substrate.

One of the major causes of outages for steam turbines used in generating electricity is due to material failure resulting from the combination of erosion, corrosion, stress, fatigue and creep. These failures are induced by the atmosphere and temperature inside the turbine and the velocity of the turbine blades. Superheated steam circulating in the system can reach 540 degrees Celsius. The amounts of chloride, sulfate and nitrate ions in the steam are often controlled, but concentrations of these ions on the order of one to ten parts per billion can give rise to concentrations of over ten weight percent in the steam condensate.

According to data published by the Electric Power Research Institute solid particle erosion of turbine blades accounts for 13.7 percent of electric utilities repair expenditures and water corrosion accounts for an additional 10.8 percent. Erosion is defined as the loss of material from a solid surface due to relative motion in contact with a fluid that contains particles. The phenomenon occurs as a result of different mechanisms depending upon the composition, size and shape of the eroding particles, their velocity and angle at impact, and the composition and microstructure of the surface being eroded.

Erosion of turbine blades occurs for many reasons. Particles are often generated as oxide scale which exfoliates from the boiler and steam conduits. These particles are carried along by the steam flow and strike the rapidly turning turbine blades. Erosion of a surface can also occur without the presence of solid particles via mechanisms of liquid erosion. For example, if there is a formation and subsequent collapse of bubbles within the liquid, cavitation erosion occurs. Cavitation damage has been observed in hydraulic pumps and turbines as well as other systems where the high speed flow of liquid causes local hydrodynamic pressures to vary widely and rapidly. This type of erosion is often evidenced on the blades in the low pressure end of large steam turbines where the components are exposed to high velocity steam containing moisture droplets.

In order to provide turbine blades which resist corrosion and erosion, the blades are generally fabricated from stainless steel because of its erosion and corrosion resistance, as well as its other mechanical properties such as creep and fatigue resistance. The tips of previous blades were sometimes fitted with an insert formed of a Stellite Haynes (Trademark) alloy to further enhance the wear resistance of the blade.

SUMMARY OF THE INVENTION

A wear resistant coating is deposited on a surface of the substrate and comprises a plurality alternating layers of a ceramic material and a metallic material. The two materials have different erosion resistive characteristics so as to complement each other. In the preferred embodiment, the interfaces between adjacent layers are formed by a gradual transition in the concentration of the materials for each layer. Specifically, the transition from one layer to the next layer is formed by gradually reducing the concentration of the material forming the one layer while the material of the next layer is increased in concentration throughout the transition region. By having a graded transition between the adjacent layers, the coating is more structurally unified and individual layers of material are less likely to be chipped or flaked off.

The present wear resistive coating may be formed by reactive radio frequency sputtering. In such a deposition method the sputtering apparatus contains a target consisting of the material for one of the layers. A layer of the target material is deposited by operating the sputtering apparatus using an inert sputtering atmosphere. The second layer material is a compound of the first material which is formed by introducing a gas into the sputtering environment which reacts with he material of the target to produce the compound of the second material. For example, if the first material is titanium and the second material is titanium nitride, a titanium target is employed and the second material is formed by introducing nitrogen gas into the sputtering environment. The development of the present invention has identified several groups of pairs of materials which are suitable for this coating.

An object of the present invention is to provide a wear resistive coating for substrates which are particularly susceptible to corrosion and erosion.

A specific object of the present invention is to provide a multi-layer wear resistive coating formed by alternating layers of two materials having complimentary wear resistive properties.

Yet another object is to provide a multi-layered structure in which the layers are bonded together in a manner which resists individual layers chipping and flaking from the coated substrate.

A further object of the present invention is to provide a wear resistive coating in the form of a plurality of layers of different materials which act to resist cracks penetrating through the coating to the underlying substrate.

Another object of the present invention is to provide a method for sputtering a multi-layer wear resistive coating without the laborious process of having to change sputtering targets in order to deposit each layer of material.

Another object of the present invention is to provide a method for depositing such a wear resistive coating on a heat treated metallic substrate in a manner which does not adversely effect the heat treatment.

BRIEF DESCRIPTION OF THE DRAWINGS

FIG. 1 is a cross-sectional view of a turbine blade to which the present novel wear resistive coating has been applied to the leading surface.

FIG. 2 is a cross-sectional view of the layers of the present wear resistive coating.

FIG. 3 is a magnified view of the transition between two layers of the present wear resistive coating.

DETAILED DESCRIPTION OF THE PRESENT INVENTION

FIG. 1 shows a turbine blade 10 as an example of a structural element to which the present wear resistive coating can be applied. Specifically, the coating 12 is applied to the leading edge of the turbine blade 10 which faces into the flow of the steam that is directed at the blade to produce rotary motion. It is over this section of the blade's surface that the significant erosion and corrosion occurs. Although only the leading edge is coated in this example, further protection can be provided by applying the coating to the entire blade surface.

FIG. 2 represents a cross-section through the coating 12 that is applied to the turbine blade 10 and illustrates that the protective coating comprises a plurality of layers 14–19. The protective coating 12 is comprised of alternating layers of a metallic material, such as titanium, and a ceramic material, such as titanium nitride. The metallic layers are evenly numbered 14, 16 and 18, while the ceramic layers are oddly numbered 15, 17 and 19 in the drawing. The materials of the ceramic and metallic layers are chosen to have complimentary wear resistant characteristics. The metallic material is relatively ductile while the ceramic material is relatively brittle as compared to each other. Ceramic materials are characterized by a high shear strength which correlates to a high hardness (generally greater than 1000 Knoop) and a high compressive strength. In contrast, metallic materials are characterized by a lower shear strength which correlates to a lower hardness value (less than 1000 Knoop) and a lower compressive strength. This difference in hardness provides a coating 12 which resists wear due to particle impact over a very wide range of angles of incidence.

If the substrate 11 on which the coating is deposited is metallic in nature, the metallic layer of the coating is typically deposited onto the substrate. However, if the substrate has nonmetallic characteristics, it may be advantageous to deposit the ceramic layer material onto the substrate first. The selection of either the metallic or ceramic material to be deposited directly onto the substrate, is chosen so as to provide the greatest adhesion of the coating 12 to that substrate.

The number of layers of alternating materials in the coating 12 may vary depending upon the environment within which the substrate 11 will be used and the nature of the corrosive and erosive effects. In some situations a relatively small number of alternating layer combinations may be sufficient to provide the protection afforded by the present multi-layer structure. However, in the case of turbine blades for use in steam turbine equipment, 40 to 50 layers may be necessary to provide the desired degree of wear resistance and a practical life span for the coating.

In addition to the number of layers varying according to the particular application of the wear resistant coating 12, the thickness of the individual metallic and ceramic layers can vary. Preliminary experiments relating to the present invention indicate that an individual layer thickness substantially between 0.10 and 5 micrometers appears to provide an adequate thickness to resist most common forms of erosion and corrosion effects. The thickness of the metallic and ceramic layers may be the same or may vary depending upon the particular application for the protective coating. In the case of the exemplary turbine blade 10 the layer of metallic, or ductile, material is on the order of 2.0 micrometers thick and the thickness of the ceramic, or brittle, material is approximately 0.5 micrometers.

There are several advantages which the present coating provides over prior coatings consisting of two relatively thick layers. Previously when cracks developed in the outer layer, the crack rapidly propagated through the entire thickness of the layer which was half the total thickness of the coating. Such cracks weaken the structural integrity of the layer resulting in the material of the layer flaking from the coating. This causes a rapid and entire removal of one of the materials of the coating system. Once one of the complimentary wear resistant materials is removed, the remaining layer is vulnerable to erosion by particle impact at the range of angles protected against by the outer layer.

However, such a rapid removal of coating material does not occur with the present novel coating. With multiple alternating layers of the protective materials, cracks can only propagate a relatively short distance through the coating to the interface with the next material. Therefore crack propagation through the multilayer coating is very poor. As the material of the cracked layer is removed, only a small amount of the coating's total thickness is lost. When one layer begins to wear away, other layers of that material are still present in the coating to provide the same wear resistance mechanism. With this multilayer system as each pair of metallic/ceramic layers wears away another pair is presented to the erosive particles. This process is repeated over and over again throughout the life of the coating.

Although extensive tests have been carried out by the inventor on a titanium and titanium nitride coating system other combination pairs of metallic and ceramic materials for the alternating layers of the coating 12 appear to have promise in providing a multi-layer wear resistant structure. For example, the metallic layers may comprise one of the elements selected from the group consisting of titanium, zirconium, hafnium and tantalum; and the ceramic material may be formed by a nitride compound of these materials. Alternatively, an oxide of the metallic material may be employed as the ceramic material in which case the metallic layer consists of aluminum, silicon, titanium, chromium, magnesium, iron, zirconium, molybdenum, tin, tungsten or tantalum. Furthermore, the material system may be formed with a carbide compound as the ceramic material. In this latter case the metallic layer is formed of titanium, zirconium, hafnium, tantalum or iron; and the ceramic material is a carbide compound of the selective metallic element.

Alternatively, the metallic layer can be an alloy of two or more metals in the above groups and the ceramic layer would then be a composite of the nitrides, oxides or carbides of the alloy constituents.

Another feature of the novel multi-layer protective coating 12 is illustrated in FIG. 3 which depicts the transition between adjacent layers 15 and 16 of the ceramic and metallic materials, for example titanium nitride and titanium respectively. In order to improve the adhesion characteristics of the various layers and to provide a more unified structure for the coating 12, the transition from one layer to the next comprises a transition region 20 in which the concentration of the ceramic and metallic layer elements varies to provide a graded, or feathered, transition. Specifically, the concentration of the material for one layer 15 decreases through the transition region along the direction 21 from the center of the first layer toward the center of the adjacent layer 16 on the opposite side of the transition region. Along this same direction 21 the concentration of the material in the adjacent layer 16 increases through the transition region. The transition region typically can be 200 to 300 Angstroms thick. The graded concentration through the transition region provides a strong bond between adjacent layers of the complementary materials which resists one layer flaking off the other layer.

In multiple layer structures, delamination of the different materials at the layer interfaces is common. In general the delamination is due to rapid fracture caused by high interfacial stresses in the structure. The source of high stress can be traced to two parameters. First, if there is a crystalline mismatch due to either different crystal structures or different lattice spacing, the atoms of the materials try to adjust by moving from their equilibrium positions. This movement induces a high stress area that has rapid lateral crack propagation. Another source of interfacial stress results from joining two materials with different thermal coefficients of expansion. As the system undergoes thermal cycling, interfacial stresses develop and fracture occurs.

The present graded interfaces help alleviate both of these sources of structural stress. A distinct lattice mismatch is alleviated by the gradual transition from one crystalline type to another. The interlayer interface region also introduces a mechanism for a gradual transition in the thermal coefficients.

The novel coating 12 can be deposited onto a wide variety of substrates using a radio frequency sputtering apparatus. Although other physical or chemical deposition methods can be used, sputtering is preferred as it minimizes the heating of the substrate thereby retaining any hardening of the substrate from conventional heat treatment. This is especially important in the case of steam turbine blades in which the benefits of heat treatment will be negated by a coating deposition process which heats the substrate substantially above 300 degrees Celsius. Furthermore, as will be described, a conventional sputtering apparatus can be employed to readily deposit the multi-layer coating having alternating layers of ceramic and metallic materials. The chemistry of the layers deposited with this technique is very dependent upon the parameters used during deposition. These parameters include system geometry, applied power, backfilled gas pressure and composition, substrate bias voltage, among others which are well understood by persons skilled in film deposition.

The sputtering apparatus utilizes a target of the material selected for the metallic layers. The target may be composed of either a single metal or a metal alloy depending on the composition of the metallic layer of the desired coating. Once the substrate is loaded into the sputtering chamber and the chamber is pumped down, an inert gas, such as argon, is introduced into the chamber so that the pressure within the apparatus is approximately 11 millitorr. Then the apparatus is exercised through conventional presputter and substrate etch cycles to prepare both the target and the substrate for deposition. The details of the sputtering technique will be described in terms of a metallic substrate and a titanium/titanium nitride coating system. However it will be readily apparent to ones skilled in the deposition art, how the present method may be adapted to the deposition of other pairs of metallic and ceramic materials onto a variety of substrates.

As noted above, when the substrate is metallic in nature, the metallic material (e.g. titanium) is deposited first onto the substrate. During the deposition of the titanium layer, the argon gas flows through the chamber at a rate of 17.5 standard cubic centimeters per minute (sccm). The chamber pressure is maintained at 11 millitorr. The target is maintained at approximately 370 volts with a forward power of 1500 watts. The sputtering apparatus is then operated in this mode for an interval that is sufficient to deposit the desired thickness of titanium onto the substrate. This interval may be determined empirically or by means of a conventional thickness sensor within the sputtering chamber.

Once the desired thickness of the titanium layer has been reached, a transition to the titanium nitride layer can commence. At this point the flow of argon is reduced to 16 sccm and nitrogen gas commences to flow through the sputtering chamber at a rate of 3 sccm. The nitrogen atoms combine with the sputtered titanium atoms to form titanium nitride which becomes deposited onto the substrate on the top of the titanium layer. As the concentration of nitrogen gas within the chamber increases a greater proportion of the titanium atoms combine with nitrogen atoms to form the titanium nitride. As a consequence, the composition of the film deposited on the substrate has a gradual transition from one of pure titanium to substantially pure titanium nitride. This transition forms the graded interface between the adjacent layers of the coating as previously described. If the ceramic layer is to be a carbide composition a hydrocarbon gas, such as methane, is used; whereas for an oxide compound oxygen is used instead of nitrogen.

Eventually the concentration of nitrogen gas reaches the point at which substantially all of the titanium atoms sputtered from the target combine with nitrogen to form titanium nitride. At this point the sputtering device is operated for a period of time that is sufficient to produce the desired thickness of the titanium nitride layer as determined either empirically or by conventional thickness sensing device.

Once the desired thickness of the titanium nitride layer has been achieved the source of nitrogen gas is gradually shut off and the flow rate of the argon is increased to 17.5 sccm. This causes the concentration of nitrogen gas within the sputtering apparatus to decrease with time, reducing the number of nitrogen atoms available within the chamber to combine with the sputtered titanium atoms to create titanium nitride. This gradual reduction in nitrogen gas produces another transition region in the sputtered coating from titanium nitride to titanium wherein the concentration of titanium nitride decreases as the concentration of titanium increases.

The cycling between the deposition of titanium and titanium nitride with graded transition regions is repeated for a plurality of cycles to produce the desired number of pairs of metallic and ceramic layers for the coating 12. The operation of the sputtering apparatus can be visually monitored by a technician observing the color of the film being deposited onto the substrate. A layer of pure titanium will have a silver metallic appearance, whereas the pure titanium nitride will have a golden color. If the titanium nitride has a brown or purple appearance the operator is provided with a visual indication that the layer's chemistry is not correct enabling the technician to make an adjustment nitrogen gas flow.

I claim:

1. A wear resistant coating on a surface of a substrate for protecting against particle induced erosion and water induced erosion and corrosion, said coating comprising at least four layers with layers of a ceramic material alternating with layers of a metallic material;

wherein said metallic material comprises one or more elements selected from the group consisting of titanium, zirconium, hafnium and tantalum; and wherein said ceramic material is a nitride compound of the selected metallic material.

2. The coating as recited in claim 1, wherein each layer has a thickness substantially in the range of 0.1 to 5.0 micrometers.

3. The coating as recited in claim 1, wherein the layers of said metallic material are substantially 2.0 micrometers thick and the layers of said ceramic material are substantially 0.5 micrometers thick.

4. The coating as recited in claim 1 wherein the interface between adjacent layers is a graded transition of the concentrations of the two materials.

5. A wear resistant coating on a surface of a substrate for protecting against particle induced erosion and water induced erosion and corrosion, said coating having a first set of layers of a ceramic material interleaved with a second set of layers of a metallic material to form a coating with at least four layers, wherein the interface between adjacent layers is a graded transition of the concentration of the two materials.

6. A wear resistant coating on a surface of a substrate for protecting against particle induced erosion and water induced erosion and corrosion, said coating comprising at least four layers with layers of a ceramic material alternating with layers of a metallic material;
wherein said metallic material comprises one or more elements selected from the group consisting of aluminum, silicon, titanium, chromium, magnesium, iron, zirconium, molybdenum, tin, tungsten and tantalum; and
wherein said ceramic material is an oxide compound of the selected metallic material.

7. The coating as recited in claim 6, wherein each layer has a thickness substantially in the range of 0.1 to 5.0 micrometers.

8. The coating as recited in claim 6, wherein the layers of said metallic material are substantially 2.0 micrometers thick and the layers of said ceramic material are substantially 0.5 micrometers thick.

9. The coating as recited in claim 6 wherein the interface between adjacent layers is a graded transition of the concentrations of the two materials.

10. A wear resistant coating on a surface of a substrate for protecting against particle induced erosion and water induced erosion and corrosion, said coating comprising at least four layers with layers of a ceramic material alternating with layers of a metallic material;
wherein said metallic material comprises one or more elements selected from the group consisting of titanium, zirconium, hafnium, iron and tantalum; and
wherein said ceramic material is a carbide compound of the selected metallic material.

11. The coating as recited in claim 10, wherein each layer has a thickness substantially in the range of 0.1 to 5.0 micrometers.

12. The coating as recited in claim 10, wherein the layers of said metallic material are substantially 2.0 micrometers thick and the layers of said ceramic material are substantially 0.5 micrometers thick.

13. The coating as recited in claim 10 wherein the interface between adjacent layers is a graded transition of the concentrations of the two materials.

* * * * *